(12) United States Patent
Paredis et al.

(10) Patent No.: US 10,746,759 B2
(45) Date of Patent: Aug. 18, 2020

(54) METHOD FOR DETERMINING THE SHAPE OF A SAMPLE TIP FOR ATOM PROBE TOMOGRAPHY

(71) Applicant: IMEC vzw, Leuven (BE)

(72) Inventors: Kristof Paredis, Oud-Heverlee (BE); Claudia Fleischmann, Leuven (BE); Wilfried Vandervorst, Mechelen (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/296,068

(22) Filed: Mar. 7, 2019

(65) Prior Publication Data
US 2019/0277881 A1   Sep. 12, 2019

(30) Foreign Application Priority Data

Mar. 8, 2018 (EP) .................................... 18160678

(51) Int. Cl.
| | | |
|---|---|---|
| *G01Q 10/04* | (2010.01) | |
| *G01Q 10/06* | (2010.01) | |
| *G01Q 30/20* | (2010.01) | |
| *G01Q 60/24* | (2010.01) | |
| *H01J 37/285* | (2006.01) | |

(52) U.S. Cl.
CPC ............. *G01Q 10/04* (2013.01); *G01Q 10/06* (2013.01); *G01Q 30/20* (2013.01); *G01Q 60/24* (2013.01); *H01J 37/285* (2013.01); *H01J 2237/282* (2013.01); *H01J 2237/2818* (2013.01)

(58) Field of Classification Search
CPC .......... G01Q 10/04; G01Q 10/06; G01Q 30/20
See application file for complete search history.

(56) References Cited

U.S. PATENT DOCUMENTS

2019/0277881 A1*   9/2019   Paredis .................. G01Q 60/24

FOREIGN PATENT DOCUMENTS

| JP | 2015175626 A | 10/2015 |
|---|---|---|
| WO | WO 00/20823 A3 | 4/2000 |

OTHER PUBLICATIONS

Extended European Search Report for Application No. 18160678.1; dated Sep. 19, 2018.

* cited by examiner

*Primary Examiner* — Nicole M Ippolito
*Assistant Examiner* — Sean M Luck
(74) *Attorney, Agent, or Firm* — Knobbe Martens Olson & Bear, LLP

(57) ABSTRACT

The disclosed technology relates to a method and apparatus for correctly positioning a probe suitable for scanning probe microscopy (SPM). The probe is positioned relative to the apex region of a needle-shaped sample, such as a sample for atom probe tomography, in order to perform a SPM acquisition of the apex region to obtain an image of the region. In one aspect, the positioning takes place by an iterative process, starting from a position wherein one side plane of the pyramid-shaped SPM probe interacts with the sample tip. By controlled consecutive scans in two orthogonal directions, the SPM probe tip approaches and finally reaches a position wherein a tip area of the probe interacts with the sample tip's apex region.

20 Claims, 4 Drawing Sheets

METHOD FOR DETERMINING THE SHAPE OF A SAMPLE TIP FOR ATOM PROBE TOMOGRAPHY

CROSS-REFERENCE TO RELATED APPLICATIONS

This application claims foreign priority to European Application EP 18160678.1, filed on Mar. 8, 2018, which is incorporated herein by reference in its entirety.

BACKGROUND

Technological Field

The disclosed technology relates to the application of scanning probe microscopy (SPM) to the imaging of the tip apex region of a needle-shaped sample, such as a sample for atom probe tomography (APT).

Description of the Related Technology

APT is a nano-scale 3-dimensional (3D) imaging technique in which each atom within the solid of interest that is emitted through field evaporation from a specifically fabricated tip, and that reaches a 2-dimensional position-sensitive detector, is identified. Evaporation is usually triggered by a pulsed laser directed at the tip or by a voltage pulse, while acceleration of the evaporated atoms takes place under the influence of a voltage difference between the tip and the detector. Under optimized conditions, this technique allows to reconstruct nano-scale volumes in 3D to a sub-nanometre resolution. Applying APT to heterogeneous structures however tends to introduce severe distortions to the resulting 3D renditions. These stem primarily from APT tip shape modifications. In the standard 3D data reconstruction algorithms, the apex region of an APT tip is assumed to be, and to remain, semi-hemispherical in shape during the course of the analysis. Any change to this shape results in distortions to the 3D reconstruction of the region that is under analysis by the APT technique. More precisely, the APT tip shape defines the shape of the electric field around the APT tip. This electric field controls the trajectories of the ionized atoms that are field evaporated from the sample. Any change in the trajectory of an evaporated atom will result in the atom striking the 2D detector in a different location from the one expected from a semi-hemispherical tip. This effectively introduces distortions into the resulting 3D reconstructed volume.

Distortions of the APT sample tip shape may be the result of differential evaporation rates occurring in heterogeneous structures. Another source of the tip distortions may be the influence of the laser pulses applied to trigger the evaporation. The laser is directed to one side of the sample, which may result in flattening of this side in the course of the APT analysis. Various ways have been suggested for determining the shape of the tip. For example, document EP2434521 relates to a laser atom probe system that includes a probe tip monitoring means. The monitoring means may be a transmission electron microscope, a scanning electron microscope, or a scanning probe microscopy (SPM). The latter includes a scanning probe mounted on a cantilever. As the tip of the probe is scanned across a surface, the cantilever moves under the influence of the scanning probe's interaction with the surface. A laser-based detection system detects the cantilever movements which are then translated into an image of the surface. Well-known SPM variants include atomic force microscopy (AFM), conductive AFM (c-AFM), magnetic force microscopy (MFM). While the principle of using SPM for measuring the shape of a needle-shaped sample tip is thereby not a novel idea in itself, there is a lack of a concrete methodology for effectively realising this task. As both the sample tip and the SPM probe tip have dimensions on the nanometre scale, the correct relative positioning of the tips prior to the actual SPM acquisition is difficult to achieve.

SUMMARY OF CERTAIN INVENTIVE ASPECTS

One objective of some aspects of the disclosed technology aims to provide a method and apparatus for performing SPM on a needle-shaped sample tip, such as a tip of a sample for APT analysis. The disclosed technology relates to a method and apparatus as disclosed in the appended claims. The disclosed technology firstly relates to a method of determining, by applying scanning probe microscopy (SPM), the shape of the apex region of the free-standing tip of a needle-shaped sample, comprising: providing a SPM apparatus comprising a SPM probe mounted on a cantilever, the cantilever having a fixed end and a free end, the probe being mounted on the free end of the cantilever and being shaped as a pyramid having a base, a tip area, and at least three side planes extending between the tip area and the base; a sample holder; a drive mechanism for driving a movement of the probe relative to the sample holder; and detection, control and representation tools for acquiring and representing an image of a surface scanned in two dimensions by the probe; mounting the sample on the sample holder, the sample tip being pointed toward the cantilever and the probe; positioning the SPM probe in a first position wherein the tip of the sample interacts with a first point on a first side plane of the pyramid-shaped probe, and wherein in the first position of the SPM probe the first plane is oriented at a non-zero angle relative to the longitudinal axis of the sample; from the first position, performing a scan movement of the probe in a first direction transverse to the first plane, thereby generating an increase of the distance between the base of the probe and the sample tip, while maintaining the interaction between the probe and the sample tip; detecting an instance at which the sample tip crosses a rib between the first plane of the pyramid-shaped SPM probe and a plane adjacent thereto; stopping the scan in the first direction; initiating a scan in a second direction transversal to the first direction (e.g. perpendicular to the first direction), thereby bringing the sample tip back into contact with the first plane; continuing the second scan to reach a position wherein the sample tip interacts with a second point on the first plane; from this second point, repeating the above first and second scan one or more times, until reaching a position wherein the tip area of the probe interacts with the apex region of the sample tip; and from this position, performing a SPM acquisition scan, thereby obtaining an image of the shape of the apex region.

According to an embodiment, the positioning the SPM probe in the first position is performed by aligning the longitudinal axis of the sample with the footprint of the first plane, as seen in the direction of the longitudinal axis, and decreasing the distance between the base of the pyramid-shaped probe and the sample until the sample tip interacts with the first plane.

According to an embodiment, the first side plane faces the fixed end of the cantilever. In other words, when regarding the side planes as triangles of which the base is placed on the cantilever: the base of the first side plane is transversal and may be perpendicular with respect to the longitudinal axis of the cantilever (i.e. the axis extending between the fixed end and the free end of the cantilever), and the mid point of the base of the first plane is closer to the fixed end of the cantilever than the mid points of the bases of the other side planes.

The inclination angle of the first plane relative to the cantilever may be larger than the inclination angle of the remaining side planes. The probe may be shaped as a pyramid with three side planes. According to an embodiment, the sample tip reaches the second point on the first plane by executing the scan in the second direction until the sample tip crosses a second rib between the first plane and a second plane adjacent thereto, and by reversing the scan in the second direction until the sample tip reaches the second point on the first plane.

The SPM apparatus applied in the method of the disclosed technology may be an apparatus for atomic force microscopy. The sample may be a sample for atom force microscopy.

The disclosed technology further relates to a SPM apparatus for performing the method of the disclosed technology, wherein the SPM apparatus is configured to automatically perform the method in a consecutive order, starting from the positioning the SPM probe at the first position, until reaching a point on the apex region of the sample tip.

DETAILED DESCRIPTION OF CERTAIN ILLUSTRATIVE EMBODIMENTS

Figure 1:
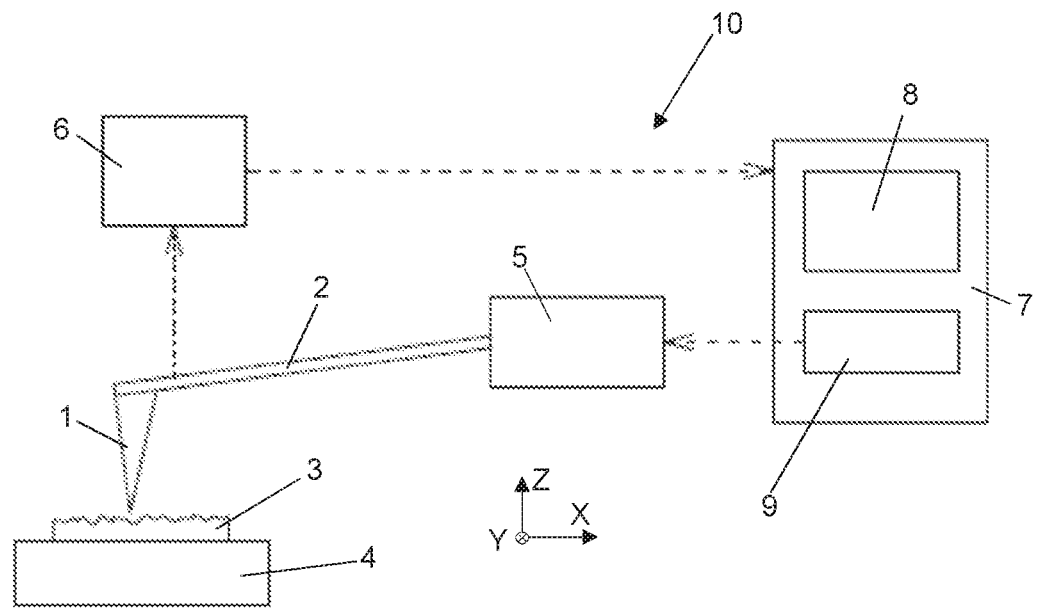
FIG. 1 shows the basic components of an AFM apparatus known in the art.

According to the disclosed technology, the positioning of the SPM probe tip relative to the apex region of the sample tip is realised by an iterative process, which utilizes the operational characteristics of the SPM apparatus for arriving at a correct position at which the SPM scan of the apex region can be started. FIG. 1 illustrates the basic components of an AFM apparatus 10 as known in the art. The AFM probe 1 is a pyramid shaped element attached to the free end of a cantilever 2. The AFM probe can be made of silicon or silicon carbide, for example. Diamond probes or metal-coated probes are also known. The shape of the probe is not always a geometrical pyramid from the base to the tip. Around the tip area, the probe may be sharpened and/or bent with respect to the main body of the pyramid. For a probe that is applicable in the method of the disclosed technology however, the larger part of the probe body from the base upward has the shape of a pyramid with a base and identifiable side planes separated by ribs, and extending between the base and a tip area of the probe. The 'tip area' of the probe may be defined as the region at the outer end of the probe that is no longer determined by ribs which separate the adjacent planes of the pyramid-shaped probe body. The side planes and the ribs of the pyramid-shaped probe are flat and straight for the larger part of the probe body extending upward from the base, but may be slightly curved when approaching the tip area, when the probe has a sharpened and/or bent extremity. Such curved portions of the pyramid (but still separated by ribs) are considered within the present context as part of the pyramid 'extending between the base and the tip area'.

A sample 3 is mounted on a sample holder 4. The fixed end of the cantilever 2 is coupled to an XYZ drive mechanism 5. Alternatively, the cantilever 2 is stationary and the drive mechanism is coupled to the sample holder 4, or both the cantilever 2 and the sample holder 4 can be coupled to their own drive mechanisms. The drive mechanism 5 is configured to impose a scanning movement on the probe 1 relative to the sample 3, in the X-Y plane, and to control the distance in the Z-direction between the sample 3 and the probe 1. Movements of the cantilever in the Z-direction are detected by a detector 6. The detector usually includes a laser and a mirror positioned to capture the laser beam reflected off the back of the cantilever 2. As the X-Y scan is performed, a signal that corresponds to the reflected beam is translated by a computer 7 into a data set that is representative of the sample's topography which may then be stored in a memory and represented on a suitable output means such as a computer screen 8. The computer 7 comprises a controller 9 configured to send control signals to the drive mechanism 5.

SPM probes may operate in a variety of operational modes known as such in the art. For example, an AFM probe may operate in contact mode, wherein the probe 1 is continuously in physical contact with the scanned surface. In an embodiment, a feedback loop maintains a constant force between the sample and the probe. Another operational mode is known as intermittent contact mode, wherein the probe is subjected to a controlled oscillation in the Z-direction at or near the cantilever's resonance frequency, by a piezo-electric transducer coupled to the cantilever, for example, and wherein the topology of the sample is detected by changes in the frequency or the amplitude of the oscillation, generated by the interaction between the probe and the surface. The interaction may be based on the direct contact forces and/or on non-contact forces such as Van der Waals forces. All of the components and operational modes described above are known as such in the art, and may be brought into practice according to known technology in the method and apparatus according to the disclosed technology. In addition to this, the apparatus of the disclosed technology is configured to perform the method of the disclosed technology, as described hereafter. The method and apparatus are described for the case of an AFM probe, but it is applicable to any SPM technique, i.e. any technique wherein a probe tip interacts with a sample through direct contact forces or other interactive forces or other types of interaction such as through current, and wherein the scanning of the probe over the sample's surface enables the imaging of the scanned surface.

Figure 2:
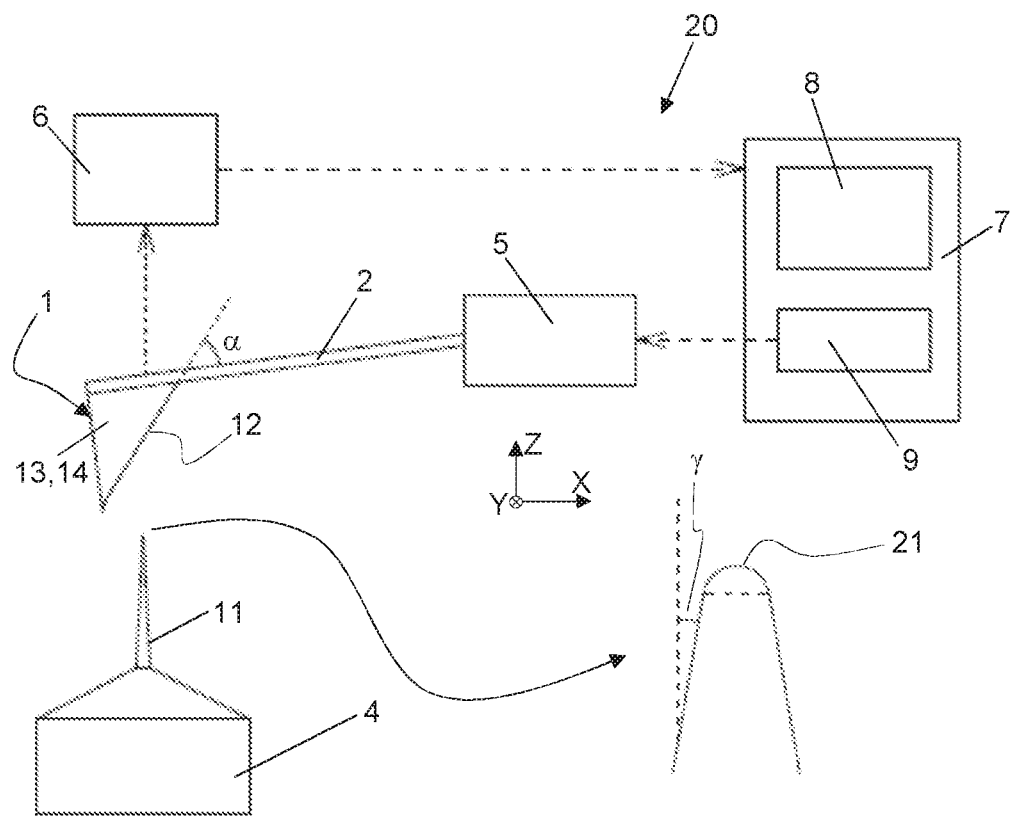
FIG. 2 illustrates an AFM apparatus suitable for performing the method of the disclosed technology. A detailed sub-portion of the drawing shows a geometry of a needle-shaped sample tip.

FIG. 2 illustrates an AFM apparatus 20 according to an exemplary embodiment of the disclosed technology. The probe 1 is now positioned facing the tip of an APT sample 11, mounted on the sample holder 4. An APT sample that has not undergone evaporation has an apex region of semi-hemispherical shape with a tip diameter of about 30-50 nm depending on the shank angle y of the sample (see detail in FIG. 2). The smaller the shank angle, the larger the initial diameter. The AFM probe tip diameter is typically in the order of 20 nm or less. As the evaporation progresses, the diameter of the apex region 21 may become considerably larger. For APT tips with non-zero shank angle γ, this can be up to 200 nm or more (and the shape may deviate from a geometrically defined semi-hemisphere due to distortions of the tip as described in the introduction). At various stages during an APT analysis, a 2-dimensional X-Y scan of the AFM probe tip along the surface of the apex region of the sample tip is therefore capable of detecting the shape of the apex region according to the known AFM technique. The difficulty is the positioning of the probe 1 relative to the sample tip for conducting a correct AFM scan.

Figure 3A:
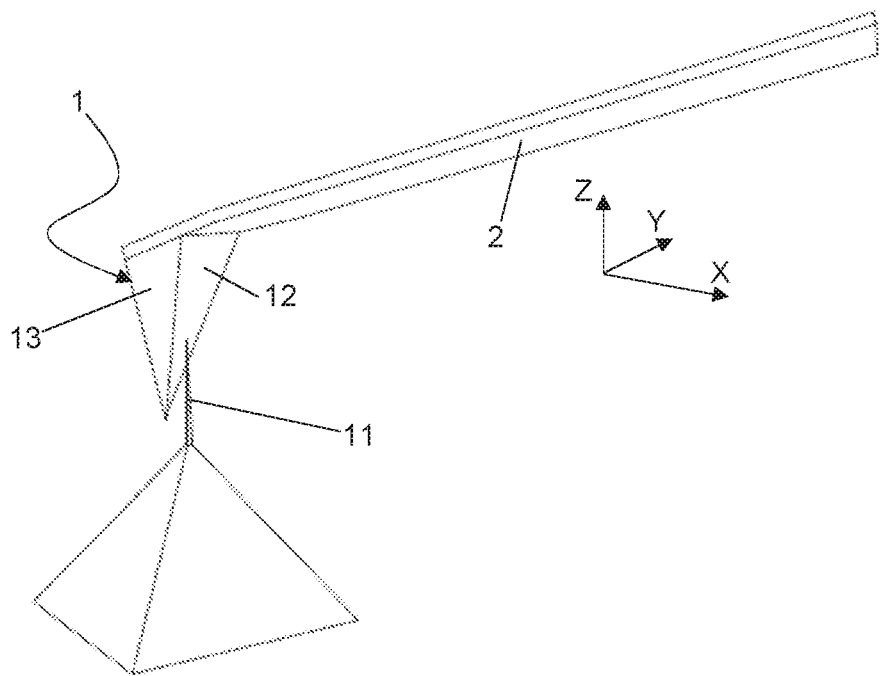
FIG. 3A is a 3D view of an initial position of a needle-shaped sample relative to an AFM probe, prior to the first interaction between the probe and the sample, according to an exemplary embodiment of the disclosed technology.
Figure 3B:
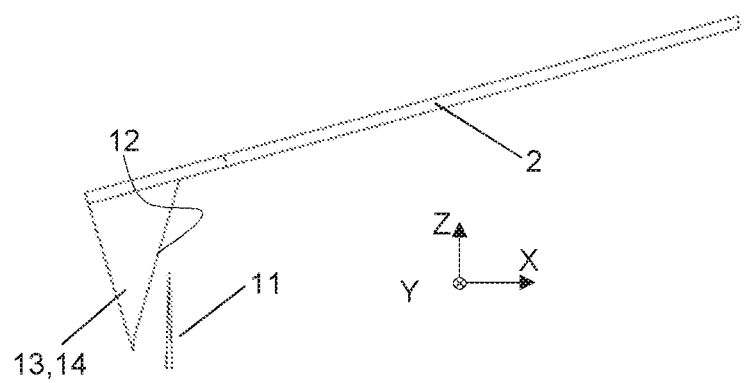
FIGS. 3B and 3C show side and top views of the initial position.
Figure 3C:
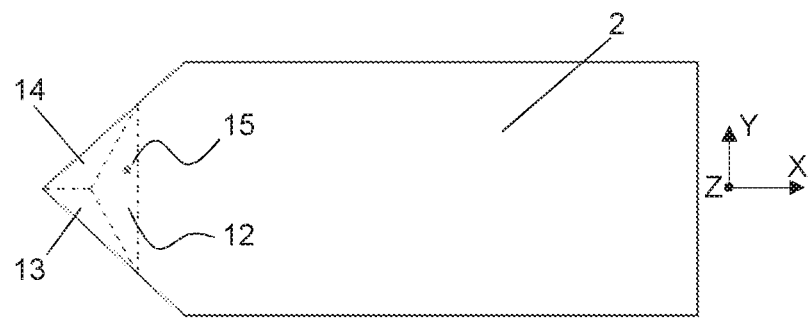
Figure 4:
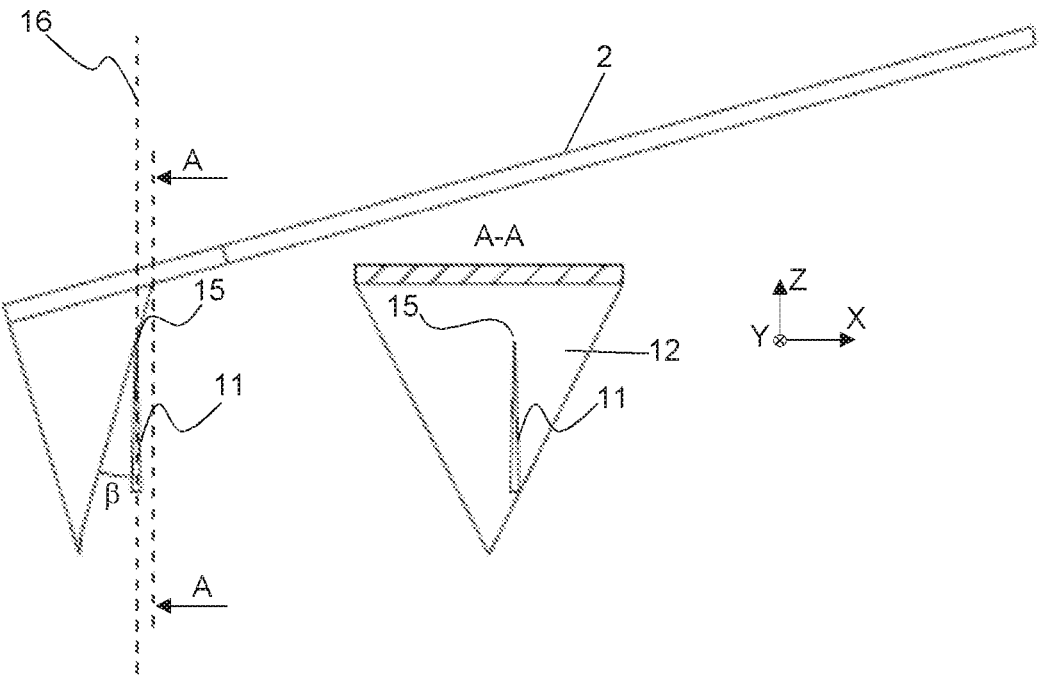
FIG. 4 shows the relative position of the probe and the sample at the start of the X and Y scan movements performed iteratively during the method of the disclosed technology.

According to the exemplary embodiment of the disclosed technology illustrated in FIGS. 2, 3 and 4, the AFM probe is shaped as a pyramid with a triangular base and three side planes 12,13,14. The inner side plane12 faces the fixed end of the cantilever 2, i.e. the base of the triangular side plane 12 is transversal and may be perpendicular to the longitudinal direction of the cantilever 2, while the two outer side planes 13 and 14 are oriented opposite the inner plane 12. The tip area of the probe 1 is slightly bent relative to the main portion of the probe body, between the base and the tip area. This main portion however clearly allows to identify three flat pyramid planes 12, 13 and 14 separated by straight ribs. The probe 1 is first positioned above the APT sample tip, in such a manner that the sample tip is placed within the vertical footprint of the inner plane 12 of the pyramid-shaped probe 1. As shown in FIG. 2, an embodiment uses a probe of which the angle a of the inner pyramid plane 12 relative to the cantilever 2 is less steep compared to the standard probe illustrated in FIG. 1. The angle a may also be less steep compared to the inclination angles of the outer side planes 13 and 14. The larger inclination angle a increases the vertical footprint of the inner surface of the pyramid and thereby facilitates the initial positioning. The disclosed technology is however not limited to this specific probe shape.

The alignment of the sample tip to the vertical footprint of the inner plane 12 may be achieved with the help of an optical microscope. FIG. 3A shows a 3D view of a suitably aligned initial position. FIGS. 3B and 3C respectively show a side view and a top view. The orientation of the X-Y plane and of the Z axis are referred to in this description as 'horizontal' and 'vertical', even though the orientation of the probe and the sample is not limited thereto. As seen in the top view, the sample tip 15 is located within the vertical footprint of the probe's inner plane 12. As seen in the side view, there is no contact between the probe's inner plane 12 and the sample tip 15. From this position, the probe 1 is moved vertically towards the sample 11, which may be done by effectively lowering the cantilever 2 or by raising the sample or both. When the inner plane 12 approaches the sample tip 15 at a distance that generates interaction of the probe with the sample, this interaction is detected by the AFM apparatus. The first interaction may be an actual physical contact when the probe operates in contact mode, and/or the detection of Van der Waals forces or other non-contact forces when the probe operates in intermittent contact mode or non-contact mode. The probe is stopped at this point, as shown in FIG. 4. This position may be reached in another way then by aligning the sample tip with the vertical footprint of the probe's inner plane 12 followed by approaching the probe towards the sample in the Z-direction. The sample tip can be aligned in the X-direction with the horizontal footprint of the inner plane 12, followed by approaching the probe towards the sample in the X-direction until the inner plane interacts with the sample tip. Regardless of how the position in FIG. 4 is reached, what is required is that in this position, a non-zero angle β is formed between one of the side planes of the probe (plane 12 in the case shown in FIG. 4) and the longitudinal axis 16 of the needle-shaped APT sample 11. In any embodiment of the disclosed technology, the initial position may be such that the sample tip 15 interacts with the bulk portion of the pyramid defined by flat side planes and straight ribs, i.e. the sample tip does not interact in the starting position with the curved extremity of the probe, in as far as the probe is provided with such an extremity.

Figure 6:
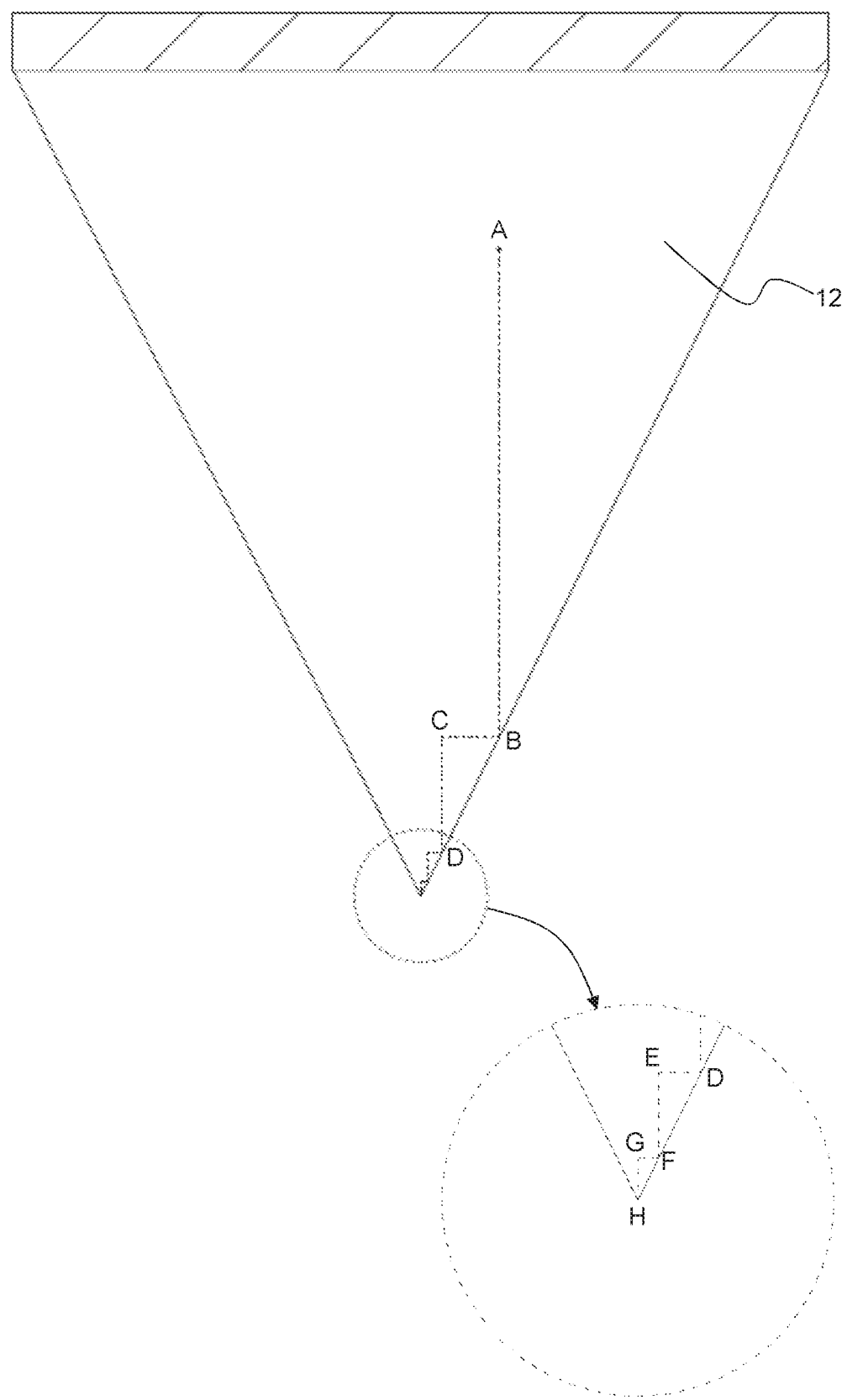
FIG. 6 illustrates the consecutive trajectories of the sample tip relative to one side plane of a pyramid-shaped AFM probe.

From this starting position, the probe is subjected to a scan movement in a direction transversal to the contacting side plane 12 of the probe. In the embodiment shown in the drawings, this scan direction is the X-direction. The presence of the APT sample tip 15 causes the cantilever 2 to move upwards relative to the sample during this X-scan, i.e. the distance between the base of the probe 1 and the sample tip 15 increases . The upward movement is the normal operational reaction of the probe to the detection of the sample, as imposed on the cantilever by the controller 9 through the drive mechanism 5 (and/or imposed on a drive mechanism coupled to the sample holder) : in contact mode, the cantilever 2 moves upward relative to the sample in order to maintain the contact with the sample as the probe moves in the X-direction. In intermittent contact mode, the cantilever moves upward relative to the sample in order to maintain a given amplitude or frequency of the probe's oscillation. As seen in the enlarged view of the pyramid's inner plane 12 in FIG. 6, the contact point between the probe and the sample moves from A to B. The term 'contact point' is used hereafter for the sake of conciseness. When the probe operates in non-contact mode, this point is the point at which the interaction between the probe tip and the sample is taking place.

Figure 5:
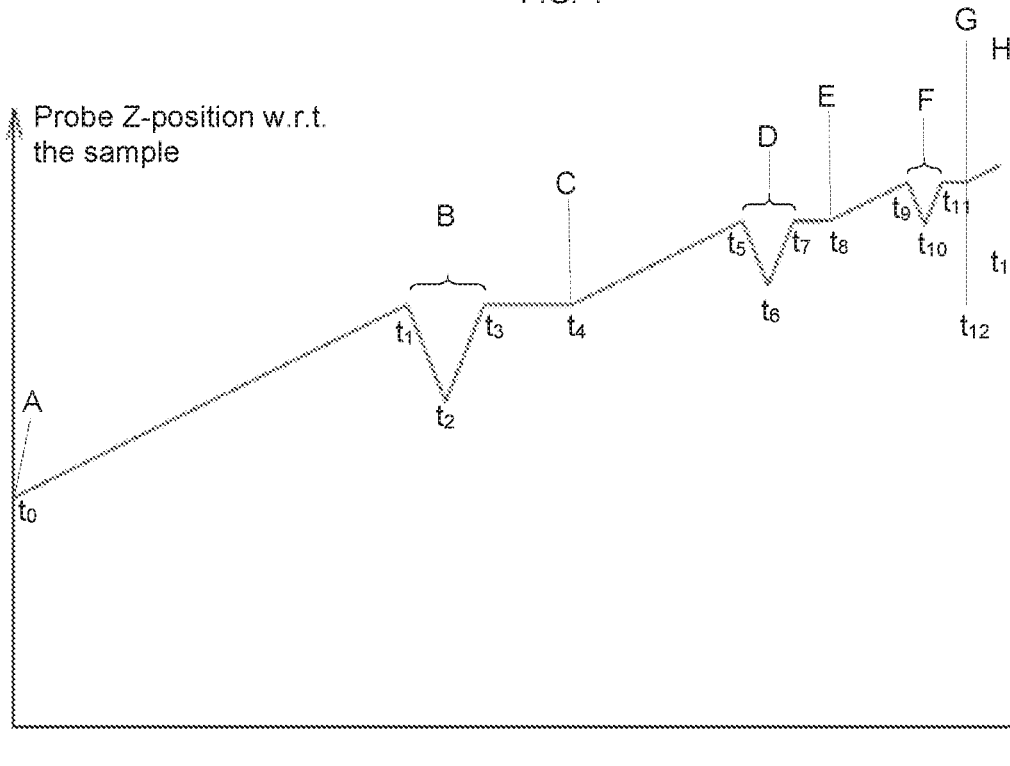
FIG. 5 shows a graph illustrating the evolution of the probe's position in the Z-direction relative to the sample during the method of the disclosed technology, in a consecutive order.

The graph in FIG. 5 illustrates the change of the probe's position in the Z-direction relative to the sample tip 15, as a function of time, starting at to, corresponding to the contact point A. At point B, the probe changes course as it now tries to maintain contact with the adjacent plane 14 of the pyramid, i.e. adjacent to the inner plane 12. As this adjacent plane 14 has a steeper inclination angle relative to the cantilever, the probe stops moving upward and starts on a downward course. This is illustrated by the drop at ti in the graph in FIG. 5. The change in direction that indicates the crossing of the rib between adjacent planes is not necessarily a drop in the Z-direction. The actual change depends on the geometric characteristics of the probe's pyramid shape. For a pyramid with a square or rectangular base, the probe will move on a horizontal course when the sample tip crosses the rib between two planes.

According to the method of the disclosed technology, the change of direction is detected and the scan in the X-direction is stopped at $t_2$. Now the probe is scanned in the Y-direction, which brings the probe back up to point B on the rib between the two adjacent pyramid planes 12 and 14, at $t_3$. The continued Y-scan now brings the contact point between the probe and the sample tip towards point C on the inner pyramid plane 12. The Y-scan is stopped at this point at $t_4$, and the probe is again scanned in the X-direction, resulting in a repetition of the above-described probe movement : now the probe moves upward until the contact point moves to point D at $t_5$, at which point the probe again drops. A second Y-scan is started at $t_6$, bringing the contact point back to the inner plane of the probe, back to point D at $t_7$ and then to point E at $t_8$. This iterative process is continued through points F and G at consecutive instances $t_9$ through $t_{12}$. The X-scan starting from G brings the probe tip area H into contact with the apex region of the sample tip. This may be determined by the fact that neither the X or Y scan produces a sharp drop or rise in the probe's vertical position, i.e. there is no longer the crossing of a rib by the sample tip between adjacent pyramid planes. This indicates that the tip area H (as defined above) of the probe is now in contact with the apex region of the sample tip, i.e. the region that is to be imaged by AFM. From this position, an X-Y scan is capable of imaging the shape of the APT sample tip's apex region.

According to an alternative embodiment, the Y-scan from point B to point C is not stopped at C, but continues until the contact point reaches the opposite rib, between the inner plane 12 and the other adjacent plane 13. When the probe moves beyond that rib, a change in direction is again detected, at which instant the Y-scan is done in reverse direction and stopped at point C before initiating the X-scan towards D. This approach allows a better control of the location of point C at which the Y-scan changes over to the X-scan. The same approach may be applied for each of the Y-scans (towards E and G in the example shown) to reach the final position.

The fact that the AFM tip area H has reached the sample tip apex region can also be determined in other ways. For example, by determining that both the X and Y scan lead to a loss of interaction between the AFM tip and the sample, i.e. when continuous or intermittent contact or interaction is lost between the two. Bringing the probe back over a small distance until the contact/interaction is restored then puts the probe into a suitable starting position for the AFM scan of the sample's apex region.

The crossing of a rib between the first plane 12 and an adjacent plane when performing the iterative X-scans need not occur always at the same rib, as is the case in the example. The opposite rib (between plane 12 and plane 13 in the example) may also be crossed, depending on the position of the points on the first plane 12 (points C, E and G in the example), at which the Y-scan changes over to a next X-scan.

The disclosed technology is not limited to the specific probe geometry nor to the probe's position relative to the sample as shown in the drawings. The probe may have more than three side planes. The initial contact or interaction between the probe and the sample may be between any of the probe's side planes and the sample tip. What counts is that in the starting position illustrated in FIG. 4 for the exemplary embodiment, i.e. the position wherein the probe's side plane first interacts with the sample tip, the angle between the side plane and the longitudinal axis 16 of the sample is not zero. If another side plane is used to contact the sample, the scan directions applied to iteratively reach the sample's apex region may need to be adapted to the orientation of the side plane.

The disclosed technology is not only applicable to APT samples, but it is applicable to any needle-shaped samples, i.e. samples having an apex region with larger dimensions than APT samples. However, the sample dimensions are within a range to which SPM methods are practically applicable.

The steps of the method may be performed in a fully standard SPM apparatus, wherein positioning the probe, monitoring the Z-position of the probe relative to the sample, stopping and re-starting the probe movements in X and Y directions are controlled manually by an operator. The method may also be performed automatically in a SPM apparatus provided with a suitable controller and/or suitable control software for performing the method steps automatically. The disclosed technology further relates to such an apparatus, wherein the control tool used to control the movement of the SPM probe relative to the sample is programmed to execute the steps of the method automatically, until reaching a suitable starting position of the probe relative to the sample tip's apex region for the actual SPM scan of the sample tip. The control tool is thus programmed to execute the following actions: detecting the instances at which the probe changes direction through the crossing of a rib between two adjacent planes of the pyramid-shaped probe body; changing the direction of the scan when such instances are detected; again changing the direction of the scan from a position wherein the probe interacts with the initial side plane of the pyramid-shaped body; and detecting when the probe tip interacts with the apex region of the sample tip.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method of determining, by applying scanning probe microscopy (SPM), the shape of an apex region of a free-standing tip of a needle-shaped sample, comprising:
   providing a SPM apparatus comprising:
      a SPM probe mounted on a cantilever, the cantilever having a fixed end and a free end, the probe being mounted on the free end of the cantilever and being shaped as a pyramid having a base, a tip area, and at least three side planes extending between the tip area and the base;
      a sample holder;
      a drive mechanism for driving a movement of the probe relative to the sample holder; and
      detection, control and representation tools for acquiring and representing an image of a surface scanned in two dimensions by the probe;
   mounting the sample on the sample holder, the sample tip being pointed toward the cantilever and the probe;
   positioning the SPM probe in a first position wherein the tip of the sample interacts with a first point on a first side plane of the pyramid-shaped probe, and wherein in the first position of the SPM probe the first plane is oriented at a non-zero angle relative to the longitudinal axis of the sample;

from the first position, performing a scan movement of the probe in a first direction transverse to the first plane, thereby generating an increase of the distance between the base of the probe and the sample tip, while maintaining the interaction between the probe and the sample tip;

detecting an instance at which the sample tip crosses a rib between the first plane of the pyramid-shaped SPM probe and a plane adjacent thereto;

stopping the scan in the first direction;

initiating a scan in a second direction transversal to the first direction, thereby bringing the sample tip back into contact with the first plane;

continuing the second scan to reach a position wherein the sample tip interacts with a second point on the first plane;

from this second point, repeating the above first and second scan one or more times, until reaching a position wherein the tip area of the probe interacts with the apex region of the sample tip; and from this position, performing a SPM acquisition scan, thereby obtaining an image of the shape of the apex region.

2. The method according to claim 1, wherein the positioning the SPM probe in the first position is performed by:

aligning the longitudinal axis of the sample with the footprint of the first plane, with reference to the direction of the longitudinal axis; and decreasing the distance between the base of the pyramid-shaped probe and the sample until the sample tip interacts with the first plane.

3. The method according to claim 1, wherein the first side plane faces the fixed end of the cantilever.

4. The method according to claim 1, wherein the inclination angle of the first plane relative to the cantilever is larger than the inclination angle of the remaining side planes.

5. The method according to claim 1, wherein the probe is shaped as a pyramid with three side planes.

6. The method according to claim 1, wherein the sample tip reaches the second point on the first plane by:

executing the scan in the second direction until the sample tip crosses a second rib between the first plane and a second plane adjacent thereto; and reversing the scan in the second direction until the sample tip reaches the second point on the first plane.

7. The method according to claim 1, wherein the SPM apparatus is an apparatus for atomic force microscopy.

8. The method according to claim 1, wherein the sample is a sample for atomic force microscopy.

9. The SPM apparatus for performing the method according to claim 1, wherein the SPM apparatus is configured to automatically perform the method in a consecutive order, starting from the positioning the SPM probe at the first position, until reaching a point on the apex region of the sample tip.

10. The method according to claim 2, wherein the first side plane faces the fixed end of the cantilever.

11. The method according to claim 2, wherein the inclination angle of the first plane relative to the cantilever is larger than the inclination angle of the remaining side planes.

12. The method according to claim 3, wherein the inclination angle of the first plane relative to the cantilever is larger than the inclination angle of the remaining side planes.

13. The method according to claim 2, wherein the probe is shaped as a pyramid with three side planes.

14. The method according to claim 3, wherein the probe is shaped as a pyramid with three side planes.

15. The method according to claim 2, wherein the sample tip reaches the second point on the first plane by:

executing the scan in the second direction until the sample tip crosses a second rib between the first plane and a second plane adjacent thereto; and reversing the scan in the second direction until the sample tip reaches the second point on the first plane.

16. The method according to claim 3, wherein the sample tip reaches the second point on the first plane by:

executing the scan in the second direction until the sample tip crosses a second rib between the first plane and a second plane adjacent thereto; and reversing the scan in the second direction until the sample tip reaches the second point on the first plane.

17. The method according to claim 2, wherein the SPM apparatus is an apparatus for atomic force microscopy.

18. The method according to claim 3, wherein the SPM apparatus is an apparatus for atomic force microscopy.

19. The method according to claim 2, wherein the sample is a sample for atom force microscopy.

20. The SPM apparatus for performing the method according to claim 2, wherein the SPM apparatus is configured to automatically perform the method in a consecutive order, starting from the positioning the SPM probe at the first position, until reaching a point on the apex region of the sample tip.

* * * * *